(12) United States Patent
Horan et al.

(10) Patent No.: US 6,316,932 B1
(45) Date of Patent: Nov. 13, 2001

(54) A-BASE UTILITY METER COVER

(75) Inventors: Patrick J. Horan, Dover, NH (US); Andre Theriault, Quebec (CA)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/307,625

(22) Filed: May 7, 1999

Related U.S. Application Data

(60) Provisional application No. 60/107,206, filed on Nov. 5, 1998.

(51) Int. Cl.⁷ ............................. G01R 1/04; G01R 11/32
(52) U.S. Cl. ..................... 324/156; 324/110; 361/669; 361/672
(58) Field of Search ................................. 324/156, 110, 324/142; 361/659, 660, 664, 667, 672, 669; 439/517; 73/431

(56) References Cited

U.S. PATENT DOCUMENTS 5,571,031 * 11/1996 Robinson et al. ................ 439/517

* cited by examiner

Primary Examiner—Hezron Williams
Assistant Examiner—Henry S. Andersen
(74) Attorney, Agent, or Firm—Carl B. Horton, Esq.; Damian G. Wasserbauer, Esq.; Armstrong Teasdale LLP

(57) ABSTRACT

An A-base utility meter cover assembly is described. The meter cover assembly is fabricated of a thermoplastic injection molding material, such as polycarbonate, and includes a base cover covered by a terminal cover. In one embodiment, the base cover includes a terminal block cavity for receiving a utility meter terminal block, and two locking tabs and a snap portion which engage openings through the terminal cover when the base cover and terminal cover are in an assembled configuration. In the assembled configuration, a dam and deflectors on the terminal cover are aligned with ribs on the base to form a continuous barrier against water flow into the terminal block cavity. The configuration of the locking tabs and snap portion also protect against tampering with meter electronics by preventing removal of the terminal cover.

13 Claims, 18 Drawing Sheets

A-BASE UTILITY METER COVER

CROSS REFERENCE TO RELATED APPLICATION

This application claims the benefit of U.S. Provisional Application No. 60/107,206, filed Nov. 5, 1998.

BACKGROUND OF THE INVENTION

This invention relates generally to utility meter assemblies and more particularly, to a weatherproof and tamper-resistant meter cover assembly.

Modern residential electric meters include a new kV A-base meter which generally has an internal assembly including a terminal block, and comparators linked to solid-state electronics for monitoring, storing and displaying utility usage data over time. In the past, A-base utility meter covers have used various housing configurations to protect the internal meter electronics and terminal block from weather conditions and tampering. However, such configurations have remained limited in their ability to effectively seal against wet weather conditions, and to protect the meter from tampering, without substantial increases in cost.

For example, known meter housing configurations use a separate sealing gasket to effectively seal the meter internal assembly against wet weather conditions, but the use of a separate sealing gasket represents substantial additional manufacturing cost.

Accordingly, it would be desirable to provide an A-base meter cover assembly which improves the protection of the meter internal assembly from wet weather conditions. It would also be desirable to provide such a meter cover assembly fabricated from molded plastic so that manufacturing costs are low. It would be further desirable to provide a meter cover assembly which improves the protection of internal meter electronics from tampering. It would be still further desirable to provide such a meter cover assembly which does not require the use of a gasket to effectively seal the meter internal assembly against wet weather conditions.

SUMMARY OF THE INVENTION

These and other objects may be attained by an A-base meter cover assembly for an electricity meter. The electricity meter can be, for example, an EV or kV A-base meter made by General Electric Company, Somersworth, N.H. The meter cover assembly, in one embodiment, is fabricated from a thermoplastic injection molding compound, such as polycarbonate, and includes a base cover and a terminal cover. The base cover includes a first portion having a top, a bottom and two sides, and includes a screw mount at about the midpoint between the two sides. The second portion includes a top wall, a bottom wall, a first side wall, a second side wall, and a front wall in a substantially boxlike configuration and forming a terminal block cavity. The second portion has a terminal block opening therethrough, and a pair of openings for mounting hardware. A first locking tab extends substantially perpendicularly from the front wall, near the first side wall. A second locking tab extends substantially perpendicularly from the second side wall near the front wall. A snap portion projects from the outer surface of the first side wall. Adjacent the terminal block openings is a plurality of continuous channels in the front wall. A plurality of ribs projects from the front wall to form a flange surrounding the terminal block opening. A first guide tab extends substantially perpendicularly from the front surface of the front wall, and a second guide tab extends substantially perpendicularly from the second side wall.

The terminal cover includes a top wall, a bottom wall, a front wall having a front surface and a rear surface, and a first side wall and a second side wall in a substantially boxlike configuration. The first side wall has an opening which corresponds to the snap portion on the base cover, and the second side wall has an opening corresponding to the second locking tab on base cover. The terminal cover front wall has an opening therethrough which corresponds to the first locking tab on the base cover. A dam and a plurality of deflectors extend from the rear surface of the terminal cover front wall.

In use, the meter cover assembly is generally assembled when the meter base cover is mounted on a utility meter base, such as an A-base. The terminal cover covers the base cover and locks into place when the base cover locking tabs insert through the corresponding openings in the terminal cover, and the snap portion inserts through its corresponding opening through the terminal cover. Thus in an assembled configuration, the meter base cover and terminal cover are maintained in an alignment in which the dam and deflectors on the terminal cover insert into the channels surrounding the terminal block opening on the base cover. The dam and deflectors make contact with the ribs projecting from around the terminal block opening to form a continuous barrier against water flow into the terminal cavity. Further, the configuration of the locking tabs and engagement protect the meter from tampering with meter electronics by providing stops against removal of the terminal cover from the base cover.

The above described meter cover assembly will meet the needs of the new kV A-base meter, using an all plastic, low-cost housing. In addition, the meter cover assembly provides protection of internal A-base meter electronics from wet weather conditions without the use of a gasket. Further, the meter cover assembly improves the protection of internal meter electronics from tampering.

DETAILED DESCRIPTION

Figure 1:
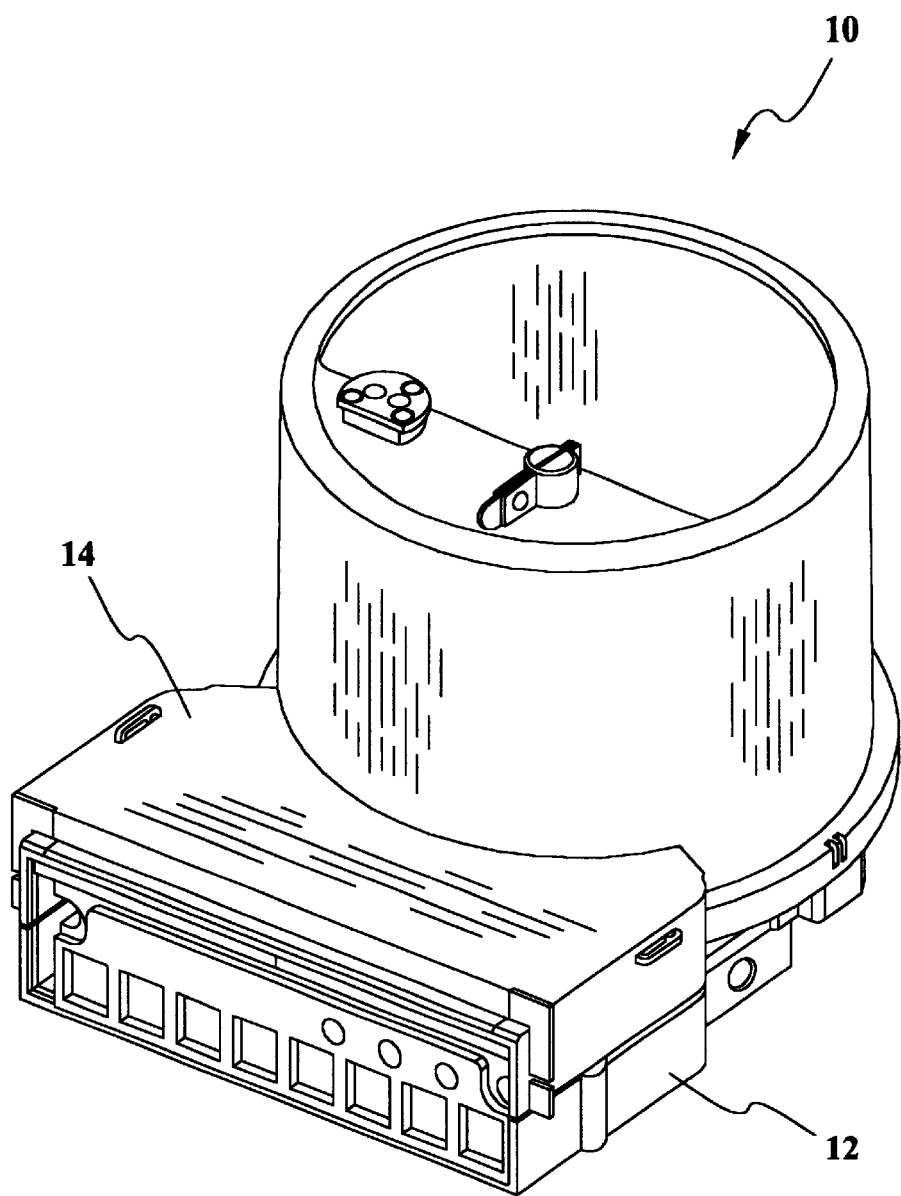
FIG. 1 is a perspective view of an electricity meter including a meter base cover and terminal cover.

FIG. 1 is a perspective view of an electricity meter 10 including a meter base cover 12 and a terminal cover 14 in accordance with one embodiment of the meter cover assembly. Electricity meter 10 can be, for example, a kV A-base meter made by General Electric Company, Somersworth, New Hampshire. The meter cover assembly, in one embodiment, is fabricated from a thermoplastic injection molding compound, such as, for example, polycarbonate.

Figure 2:
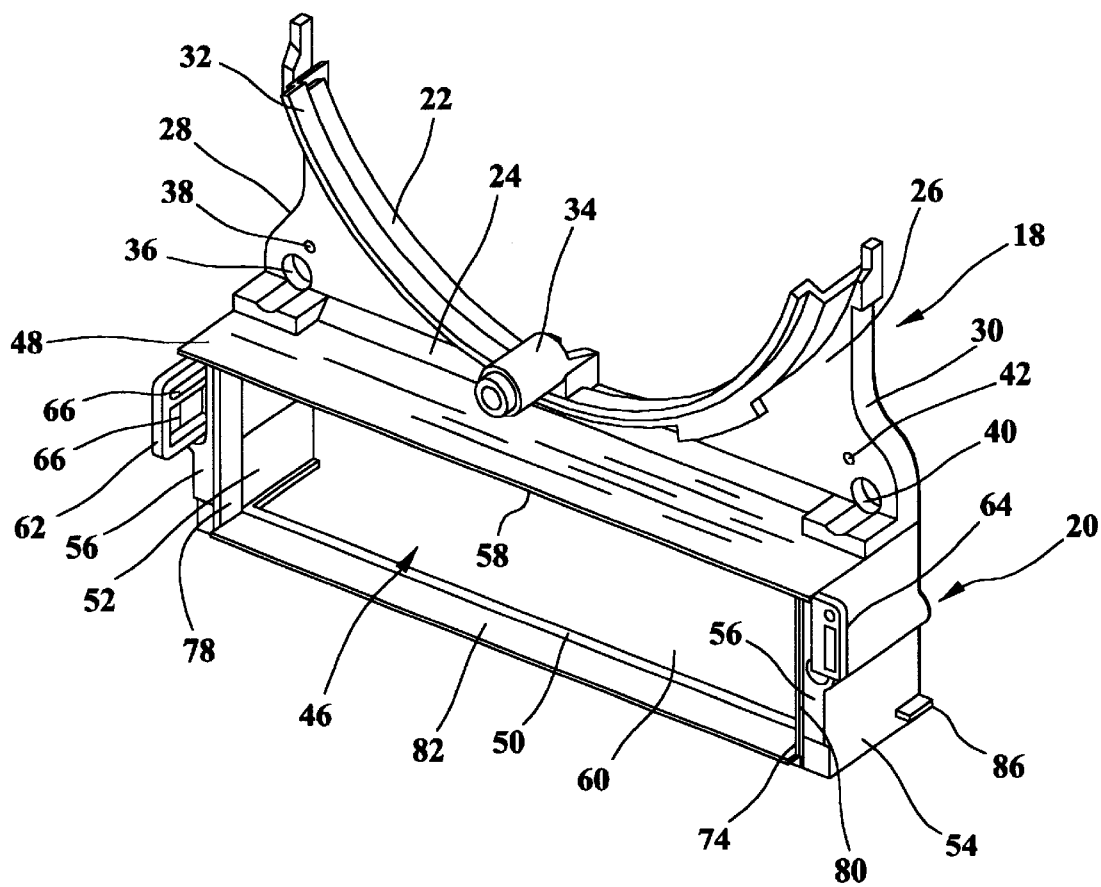
FIG. 2 is a front perspective view of the meter base cover.

Referring to FIG. 2, base cover 12 generally includes a first, upper portion 18 and a second, lower portion 20. Upper portion 18 has a top 22, a bottom 24, a front 26, a first side 28 and a second side 30. Upper portion top 22 has a generally arcuate shape and includes a flange 32 projecting perpendicularly with respect to front 26. In one embodiment, upper portion 18 includes a screw mount 34 and openings 36, 38, 40 and 42. Screw mount 34 is positioned at about the midpoint of top 22 between sides 28 and 30, but may alternatively be placed elsewhere along top 22. Lower portion 20 has a substantially boxlike configuration which forms a terminal block cavity 46. More specifically, terminal block cavity 46 is formed by a top wall 48, a bottom wall 50, a first side wall 52, a second side wall 54, and a front wall 56 having a front surface. Top wall 48 projects beyond the front surface of front wall 56 to form an overhang 58. Front wall 56 includes a terminal block opening 60 therethrough. A first locking tab 62 extends substantially perpendicularly from the front surface of front wall 56, near first side 52, and a second locking tab 64 extends substantially perpendicularly from second side 54 near front wall 56. Thus, first locking tab 62 and second locking tab 64 are oriented substantially perpendicularly to one another.

First locking tab 62 is a projection having a long edge oriented along a vertical axis with respect to lower portion top wall 48, and extends substantially perpendicularly from the front surface of front wall 56. Second locking tab 64 is a projection having a long edge oriented along a vertical axis with respect to lower portion top wall 48, and extends substantially perpendicularly from second side 54. In one embodiment, first locking tab 62 and second locking tab 64 have openings 66 therethrough.

Figure 3:
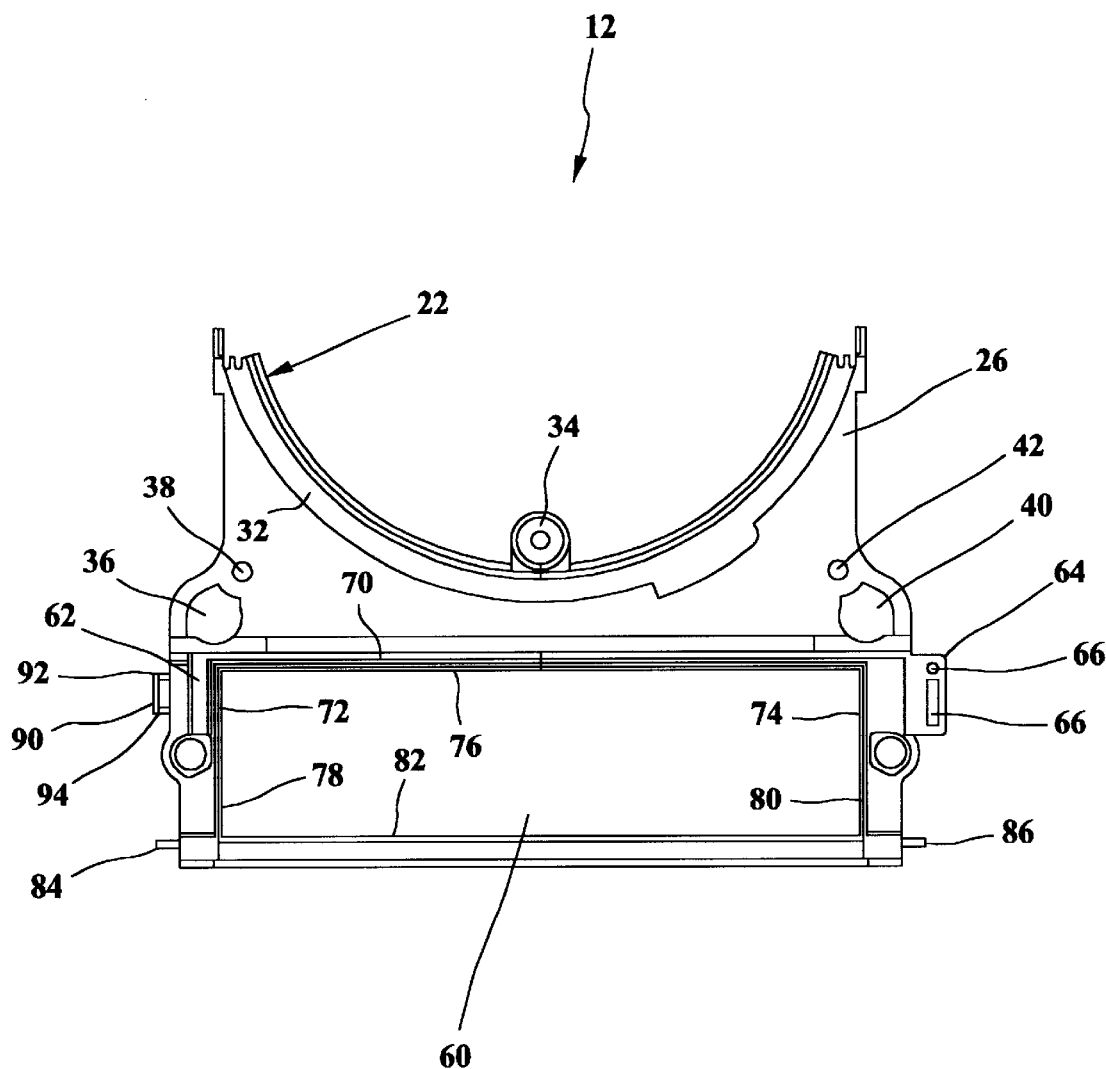
FIG. 3 is a front view of the meter base cover.

Referring the FIG. 3, adjacent terminal block opening 60 are a plurality of channels 70, 72, and 74 molded in the front surface of front wall 56. Channels 70, 72 and 74 are continuous with one another. A first rib 76, second rib 78, third rib 80 and fourth rib 82 project from the front surface of front wall 56 at or near the outer rim of opening 60, forming a flange surrounding opening 60. Ribs 76, 78 and 80 are substantially parallel to channels 70, 72 and 74, and are interposed respectively between channels 70, 72, and 74, and opening 60. A first guide tab 84 extends from first side wall 52, and a second guide tab 86 extends from second side wall 54. First guide tab 84 is a projection having a long edge oriented along a horizontal axis with respect to lower portion top wall 48, and extends substantially perpendicularly from second side 52. Similarly, second guide tab 86 is a projection having a long edge oriented along a horizontal axis with respect to lower portion top wall 48, and extends substantially perpendicularly from second side 54.

Figure 4:
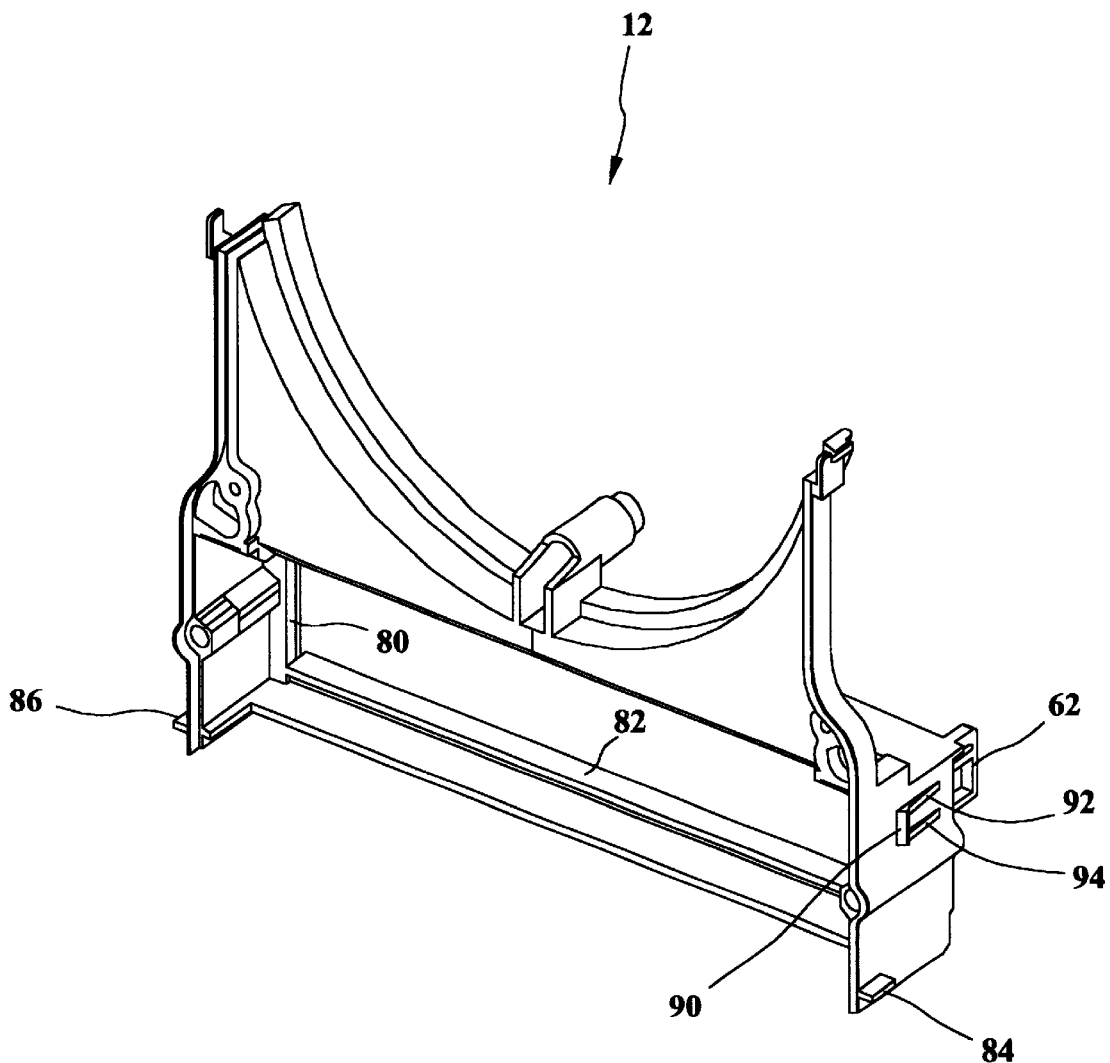
FIG. 4 is a rear perspective view of the meter base cover.

FIG. 4 is a rear perspective view of meter base cover 12. A snap portion 90 and two ribs 92 and 94 project from first side 52. Ribs 92 and 94 ramp upwards from the surface of first side 52 to meet snap portion 90. Guide tab 84 extends from first side 52.

Figure 5:
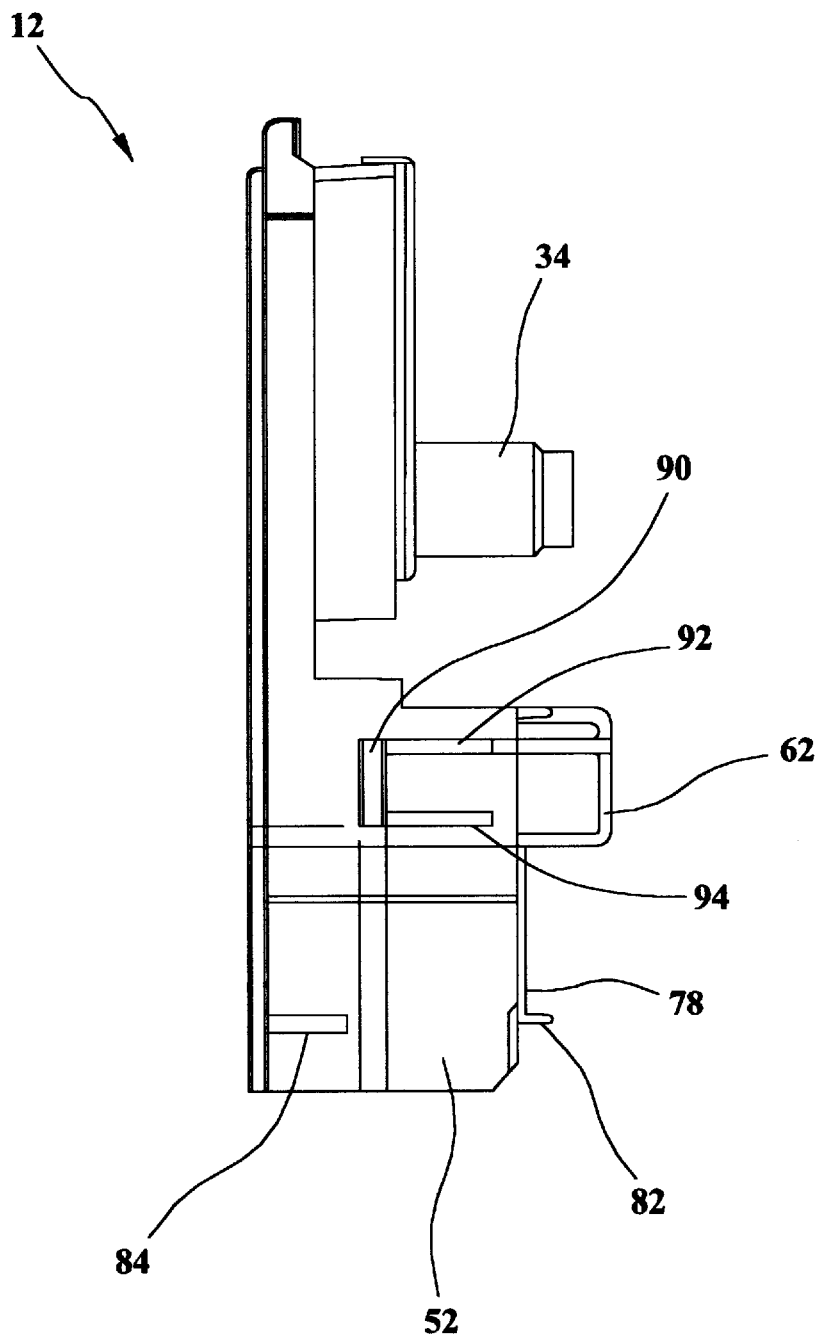
FIG. 5 is a side view of the meter base cover.
Figure 6:
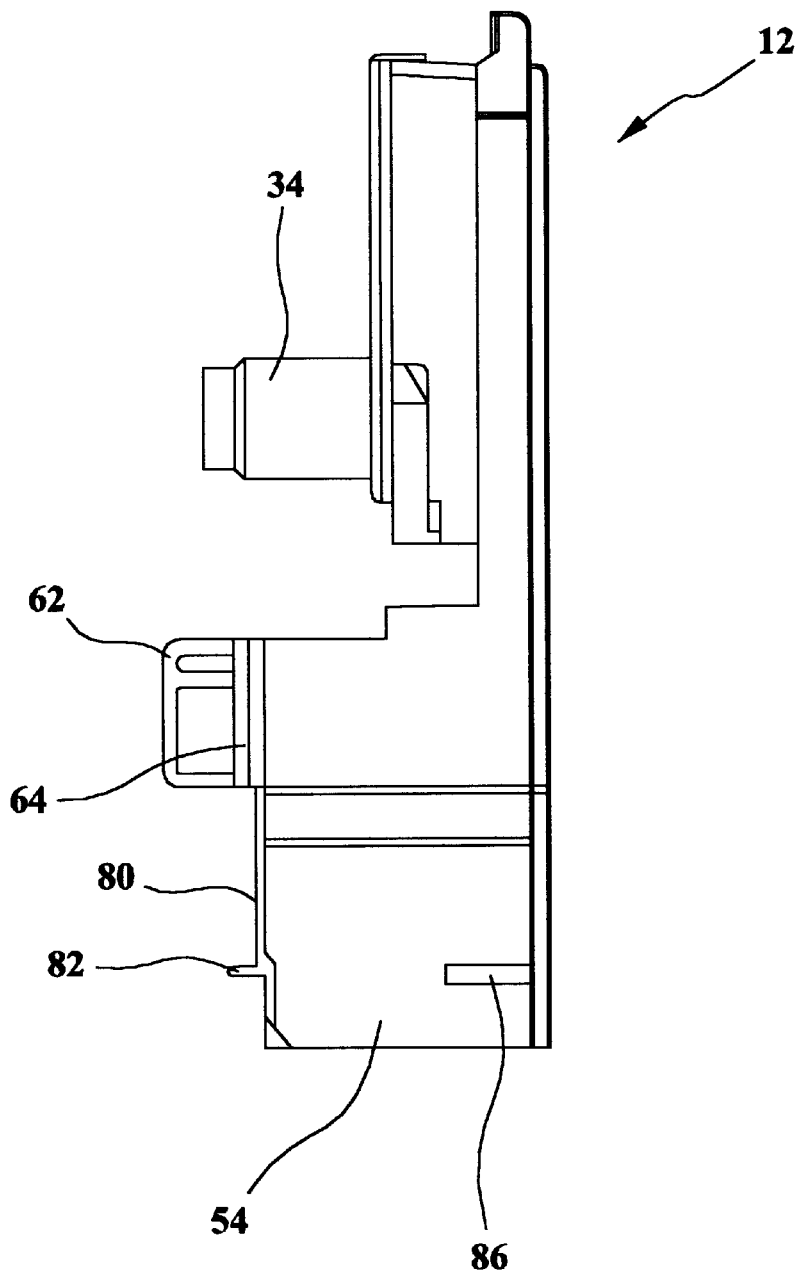
FIG. 6 is a side view of the meter base cover.

FIG. 5 is a side view of base cover 12 showing the relative positions of snap portion 90, and ribs 92 and 94, with respect to first guide tab 62. More specifically, and in one embodiment, snap portion 90 and ribs 92 and 94 are positioned within the vertical extent of first locking tab 62. First guide tab 84 projects from side wall 52, below snap portion 90 and ribs 92 and 94. Another side view of meter base cover 12, showing second side wall 54, is shown in FIG. 6. Second locking tab 64 and guide tab 86 project from second side wall 54.

Figure 7:
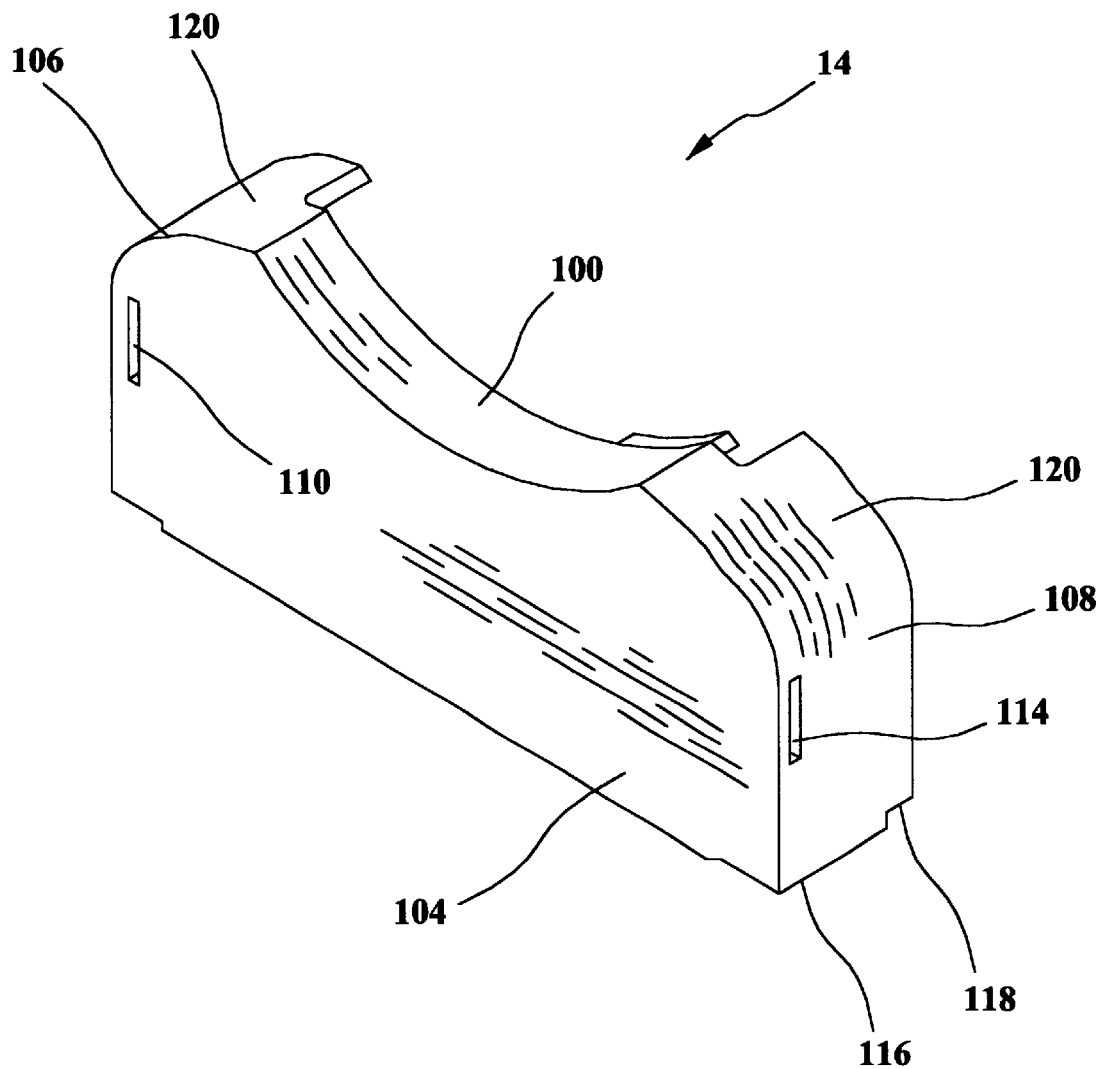
FIG. 7 is a front perspective view of the terminal cover.
Figure 8:
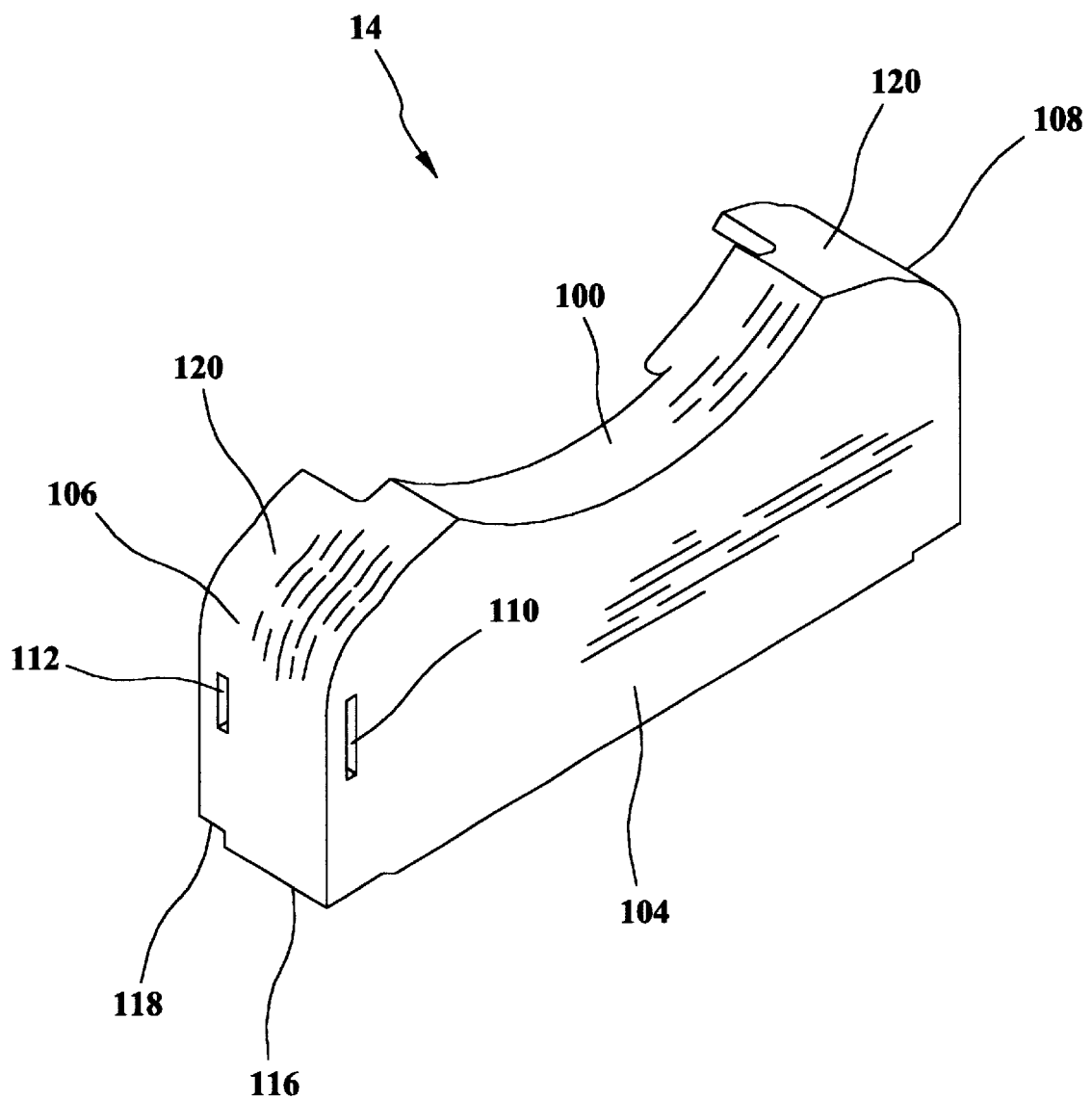
FIG. 8 is a front perspective view of the terminal cover.
Figure 9:
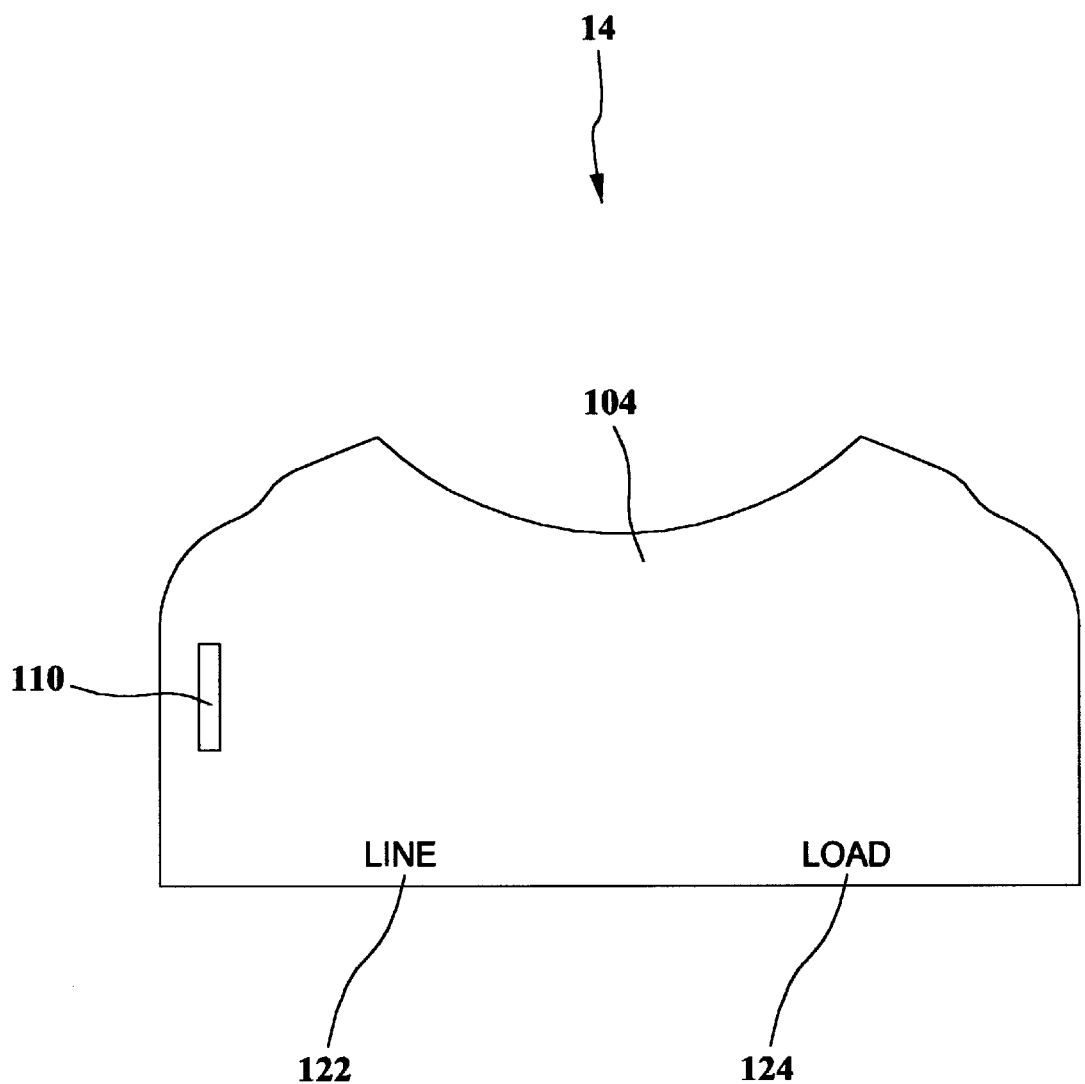
FIG. 9 is a front view of the terminal cover.

FIGS. 7 and 8 are complementary front perspective views of terminal cover 14. Cover 14 generally is sized proportionately to base cover 12 so that terminal cover 14 fits over base cover 12 while engaging locking tabs 62 and 64, and snap portion 90 on base cover 12. Cover 14 generally has a top wall 100, a bottom wall 102 (not shown in FIGS. 7 or 8), a front wall 104 having a front surface and a rear surface, a first side wall 106 and a second side wall 108, the walls coupled together in a substantially boxlike configuration. Front wall 104 has an opening 110 therethrough which corresponds to first locking tab 62 on base cover 12. First side wall 106 has an opening 112 (shown in FIG. 8) therethrough which corresponds to snap portion 90 on base cover 12. Second side wall 108 has an opening 114 therethrough which corresponds to second locking tab 64 on base cover 12. In one embodiment, openings 110, 112, and 114 are slots. Each side wall 106 and 108 has a lower edge 116 having a notch 118 for engaging guide tabs 84 and 86, and a shoulder portion 120 which meets top wall 100. FIG. 9 is a front view of one embodiment of terminal cover 14, in which a "Line" label 122 and a "Load" label 124 is molded, or otherwise imprinted, on the front surface of front wall 104. FIG. 9 also shows opening 110 through front wall 104.

Figure 10:
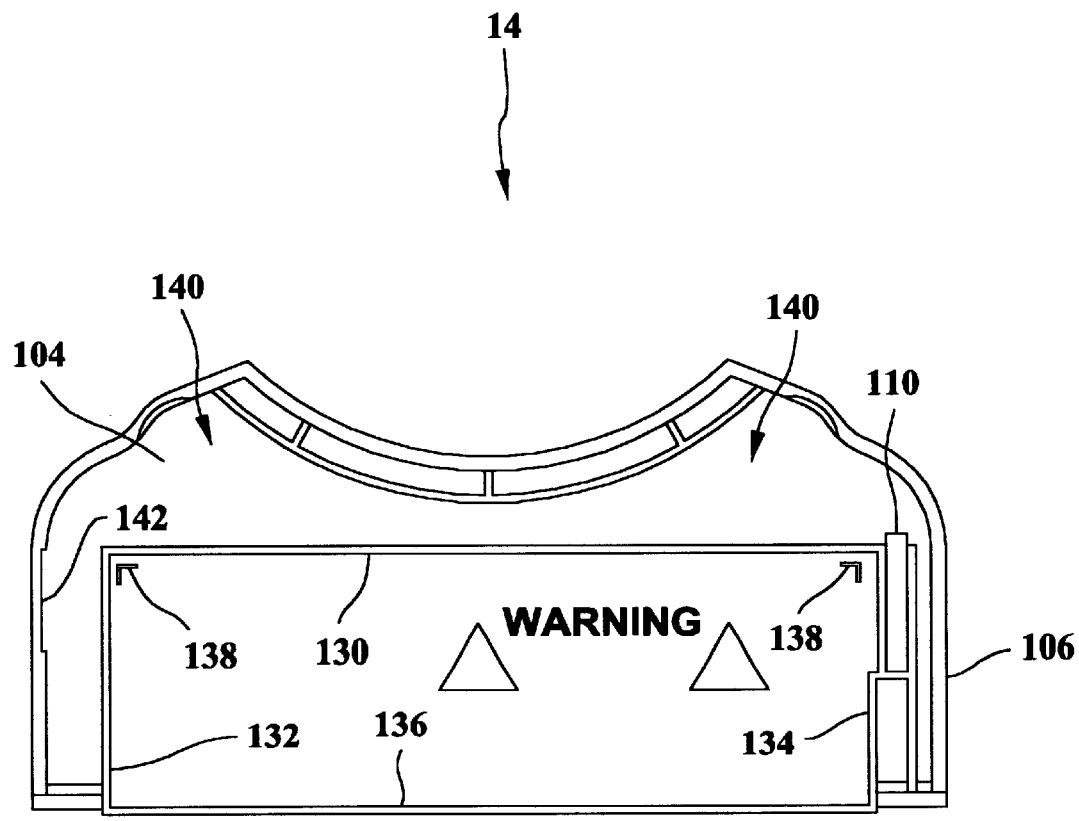
FIG. 10 is a rear view of the terminal cover.
Figure 11:
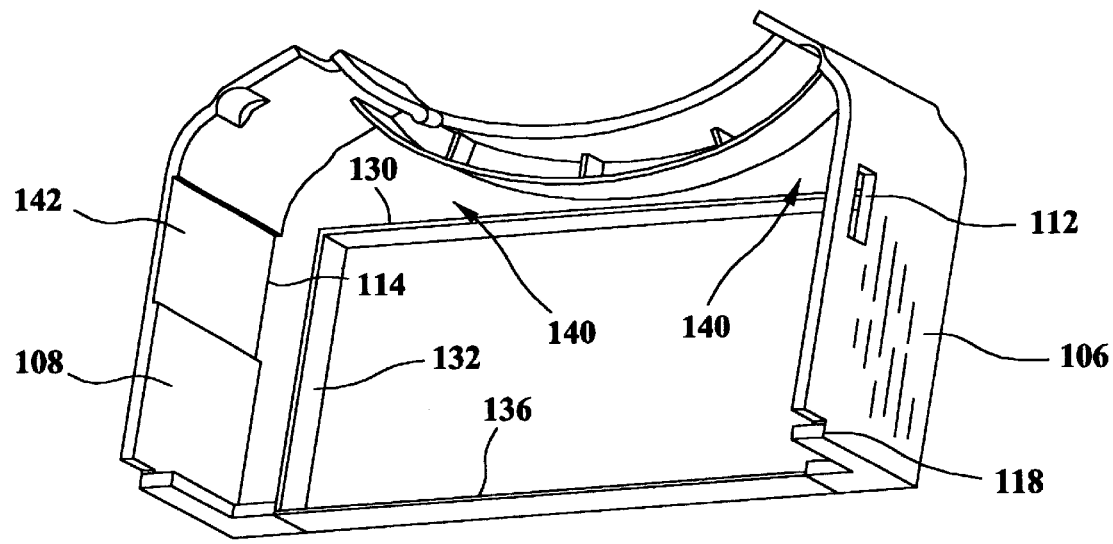
FIG. 11 is a rear perspective view of the terminal cover.

FIG. 10 is a rear view of the terminal cover 14. A dam 130, and deflectors 132, 134 and 136 extend from the rear surface of front wall 104 to form a continuous barrier to water, as explained below. Dam 130 and deflectors 132, 134 and 136 are a plurality of mating ribs for, and similar to, ribs 76, 78, 80 and 82. More specifically, dam 130 and deflectors 132, 134 and 136 are positioned accordingly on the rear surface of front wall 104 to correspond, or mate, respectively with ribs 76, 78, 80 and 82. In one embodiment, tick marks 138, for aligning an optional gasket, are imprinted on the rear surface of front wall 104. Above dam 130, top wall 100 and shoulder portions 120 of side walls 106 and 108 form a gasket cavity 140. Side 108 has a cut-out 142 or ramp, shown more clearly in the rear perspective view in FIG. 11.

Figure 12:
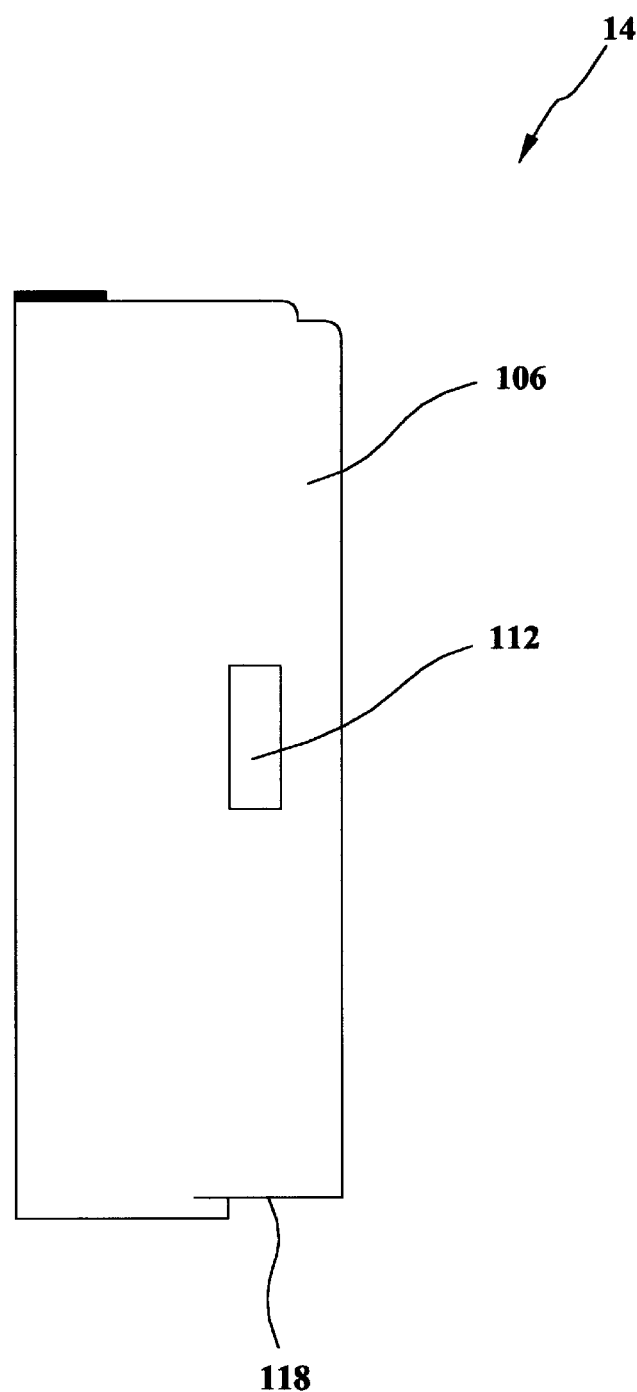
FIG. 12 is a side view of the terminal cover.
Figure 13:
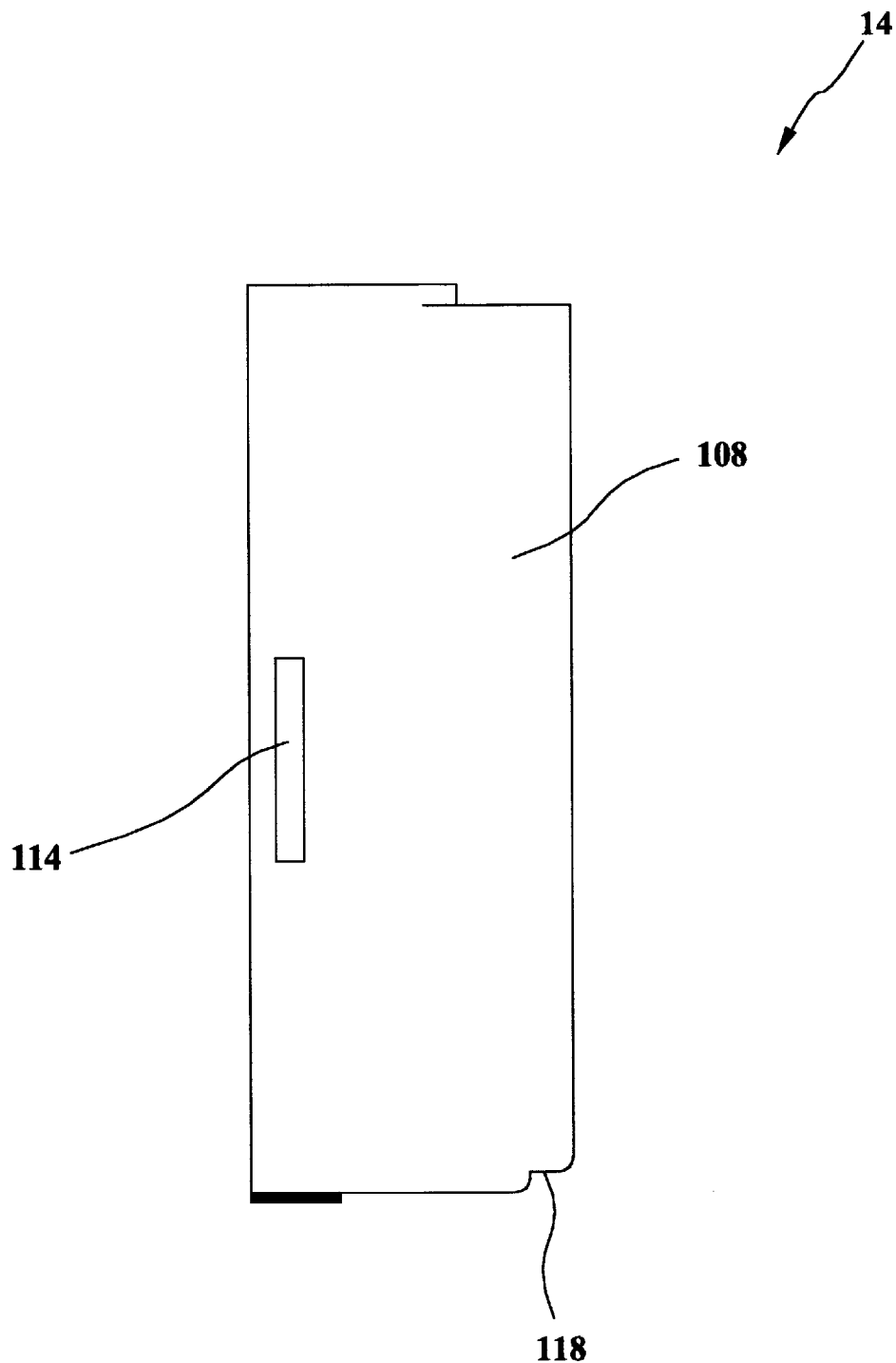
FIG. 13 is a side view of the terminal cover.

FIGS. 12 and 13 show complementary side views of terminal cover 14. FIG. 12 shows first side wall 106, with opening 112 and notch 118. FIG. 13 shows second side wall 108 with opening 114 and notch 118.

Figure 14:
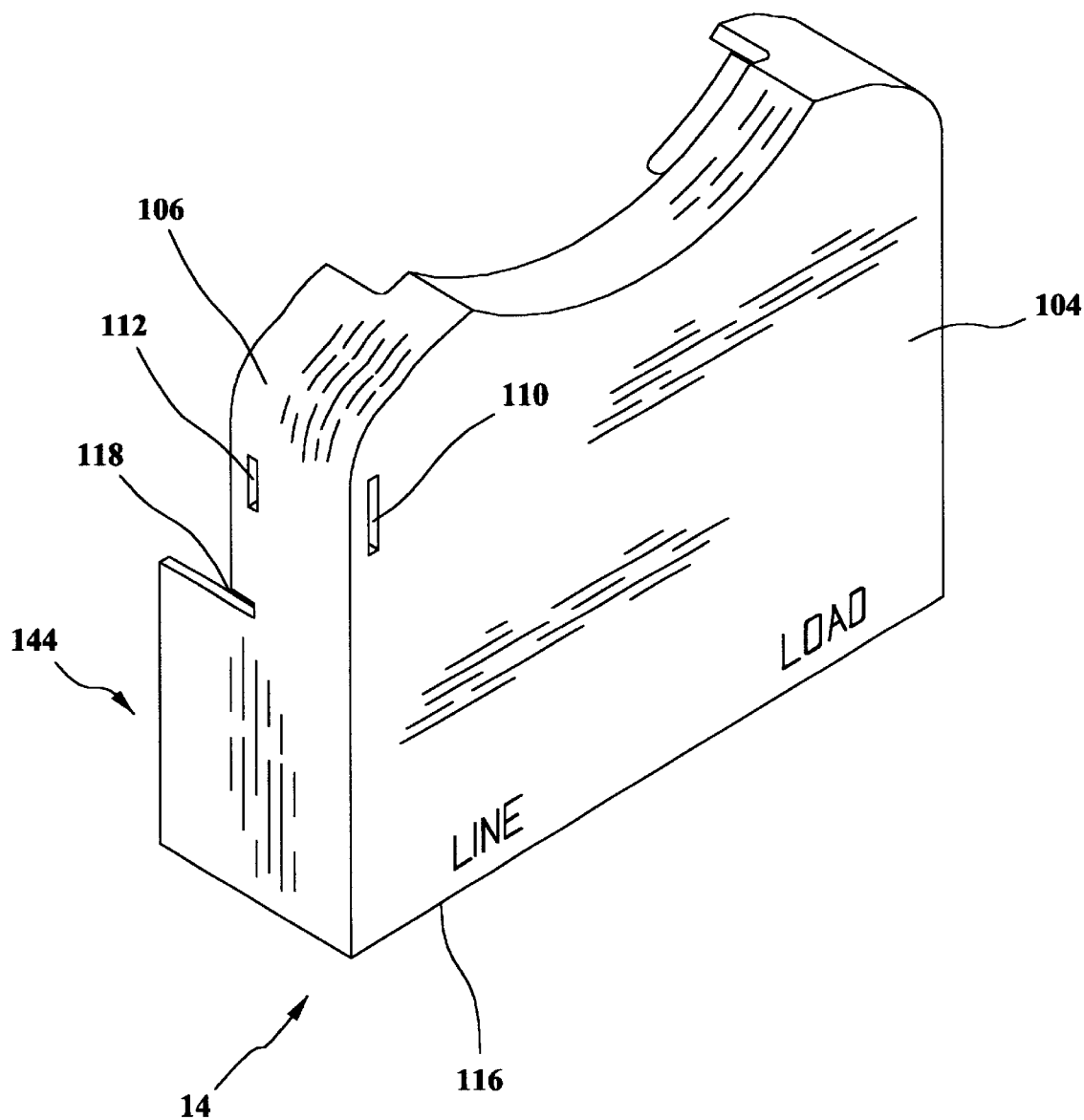
FIG. 14 is a front perspective view of an alternative embodiment of the terminal cover.
Figure 15:
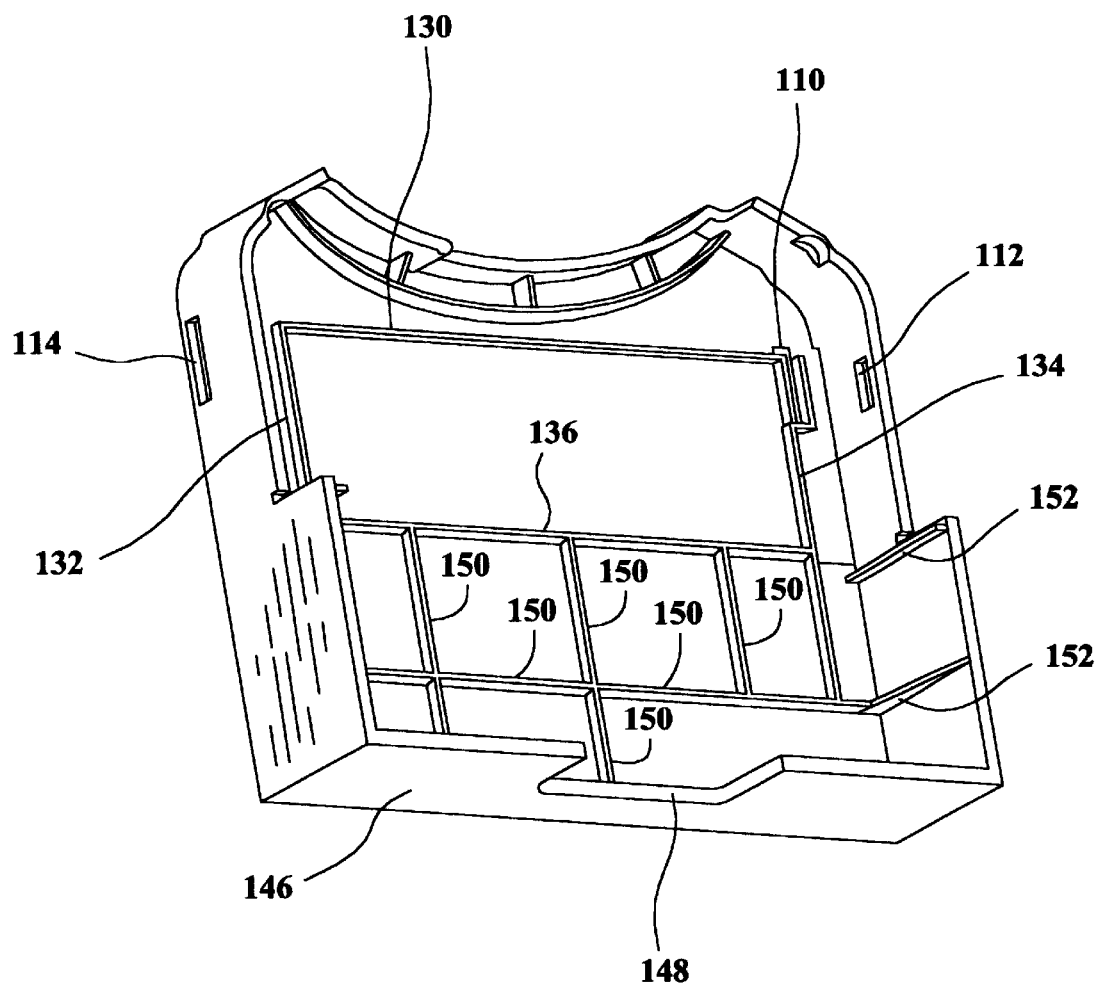
FIG. 15 is a rear perspective view of the terminal cover shown in FIG. 14.

FIG. 14 is a front perspective view of an alternative embodiment of the terminal cover 14. Front wall 104 and sides 106 and 108 (not shown in FIG. 14) are extended in length relative to the embodiment shown in FIGS. 7 - 13. Generally, sides 106 and 108 include a lower portion 144, which extends from lower edge 116 and below notch 118. FIG. 15 is a rear perspective view of terminal cover 14 with a bottom wall 146 having a cut-out 148 or opening therethrough. A plurality of stiffening ribs 150 also extend from the rear surface of front wall 104, below deflector 136. Stiffening ribs 150 may be oriented, for example, at right angles to one another. Additional stiffening ribs 152 extend from the inner surfaces of sides 106 and 108.

Figure 16:
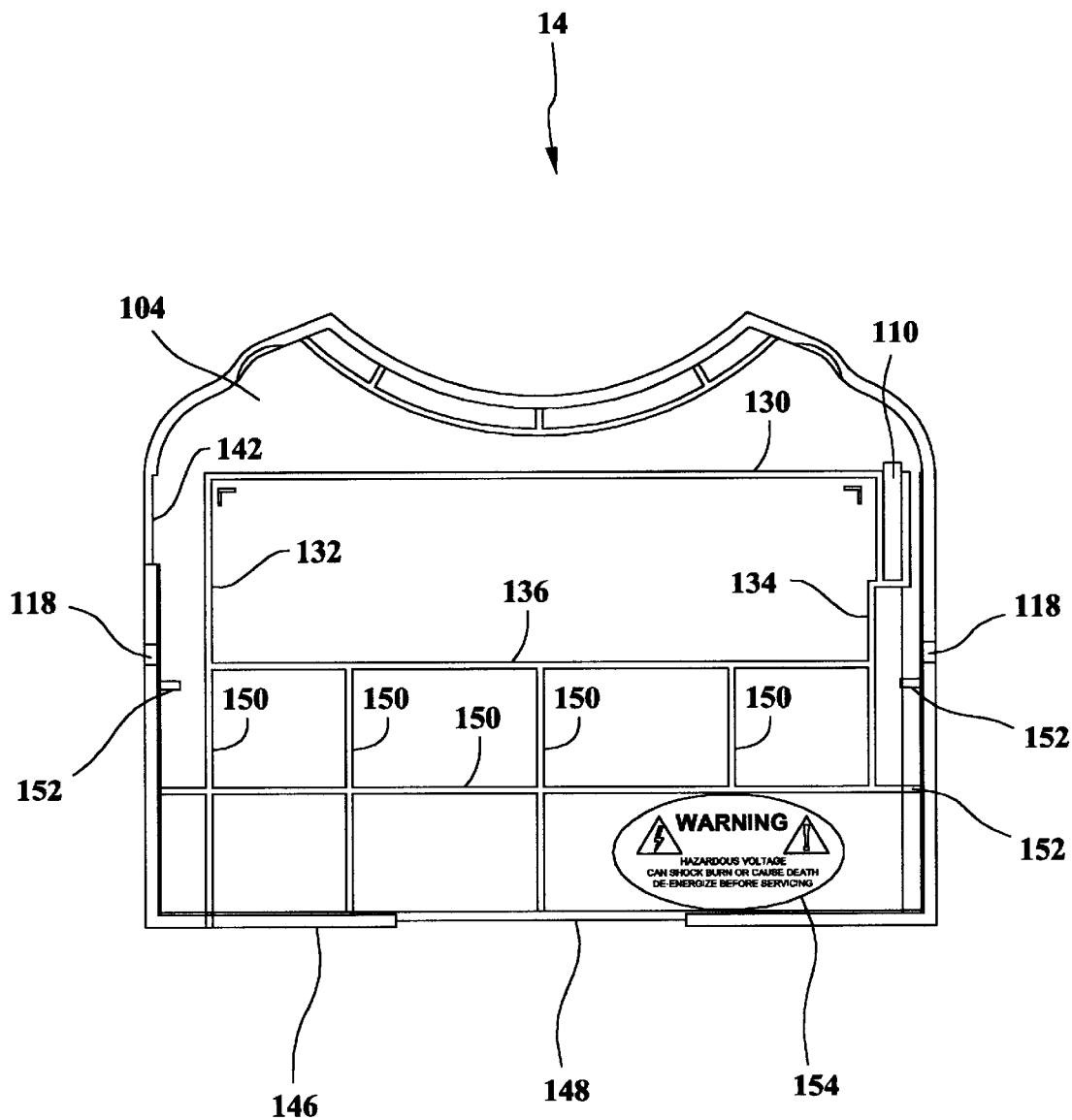
FIG. 16 is a rear view of the terminal cover shown in FIG. 14.

FIG. 16 is a rear view of the terminal cover shown in FIG. 14 showing stiffening ribs 150 on the rear surface of front wall 104, below deflector 136. In one embodiment a warning label 154 is imprinted on the rear surface of front wall 104.

Figure 17:
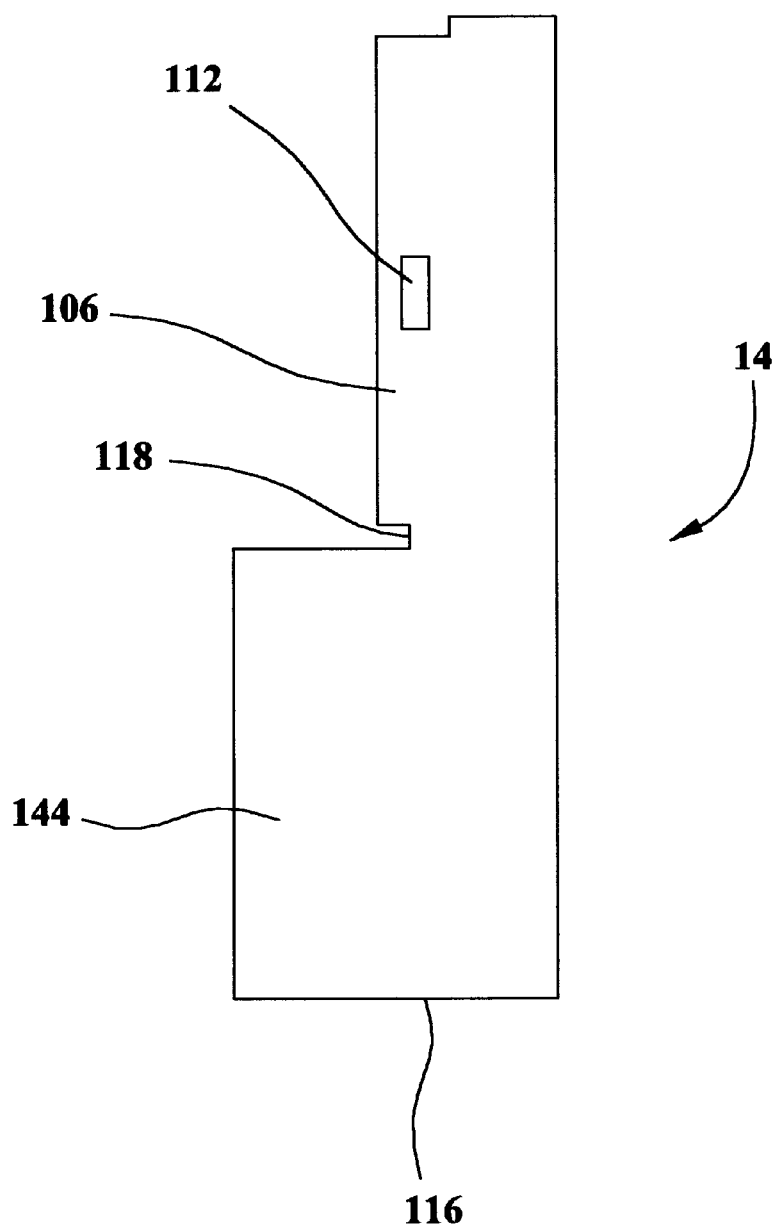
FIG. 17 is a side view of the terminal cover shown in FIG. 14.
Figure 18:
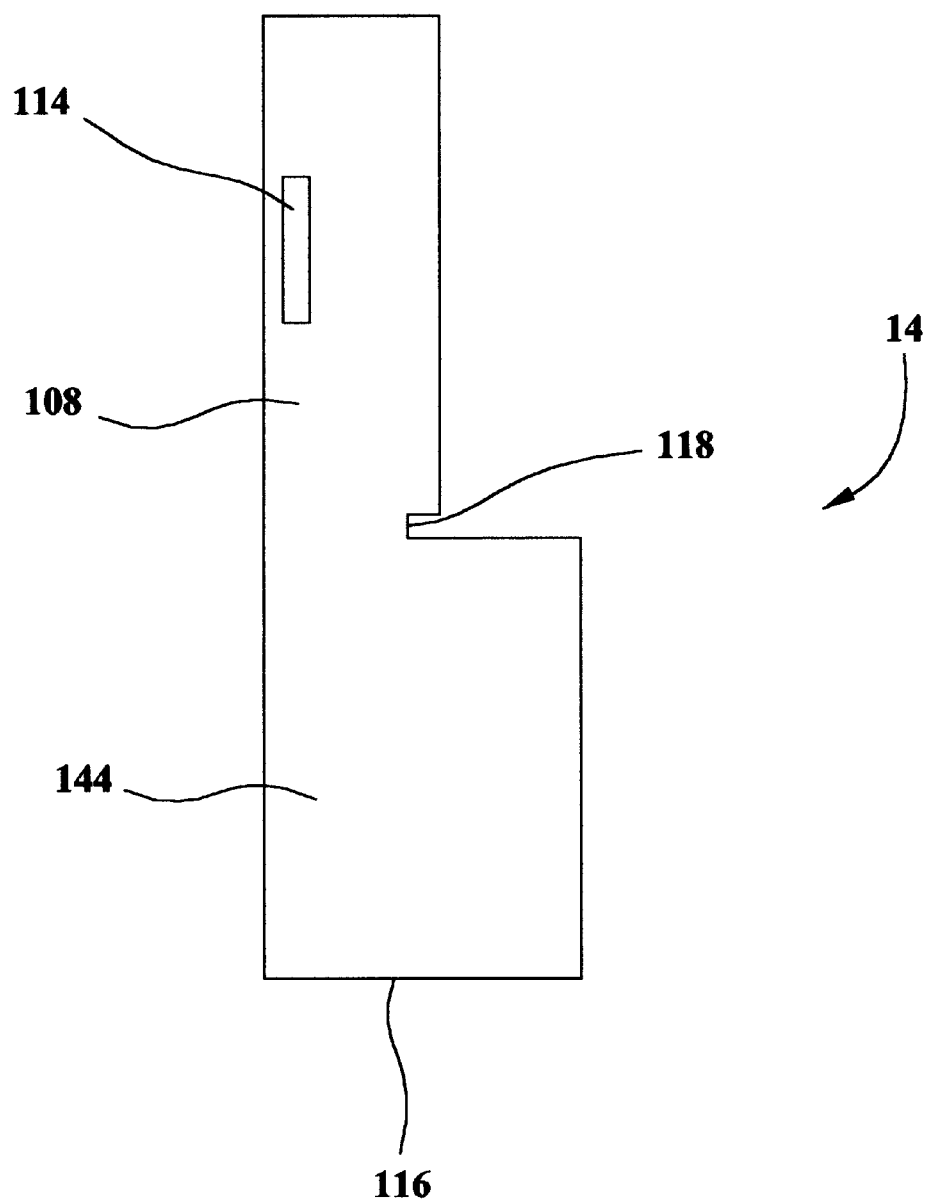
FIG. 18 is a side view of the terminal cover shown in FIG. 14.

FIG. 17 is a side view of the terminal cover 14 shown in FIG. 14, showing side 106 with lower portion 144 extending from lower edge 116 of side 106, and below notch 1 18. Similarly, FIG. 18 is a side view of terminal cover 14, showing side 108 with lower portion 144 extending from lower edge 116 of side 108, and below notch 118.

In use, terminal cover 14 mounts onto meter base cover 12 in an assembled configuration as shown in FIG. 1. In the assembled configuration, base cover 12 and terminal cover 14 cooperate to form a water-tight and tamper proof seal. Generally, locking tabs 62 and 64, and snap portion 90 on base cover 12 insert through corresponding openings on terminal cover 14 to lock terminal cover 14 into place on base cover 12. Guide tabs 84 and 86 engage notches 118. In the assembled configuration, ribs 76, 78, 80 and 82 on base cover 12, and dam 130 and deflectors 132, 134 and 136 on terminal cover 14 form a continuous barrier against the flow of water into the terminal block cavity.

More specifically, in the assembled configuration, first locking tab 62 inserts through opening 110, and second locking tab 64 inserts through opening 114. Snap portion 90 inserts through opening 112. In assembling terminal cover 14 on base cover 12, cut-out 142 allows locking tab 64 to slide more easily into place to insert through opening 114. Also to aid in assembly, ribs 92 cam the leading edge of first side 106 up and over snap portion 90, thereby allowing snap portion 90 to snap into place through opening 112. The approximately perpendicular orientation of second locking tab 64 with respect to base cover side 108 forms a tamper proofing stop against removal of cover 14 from base cover 12. Snap portion 90 similarly forms a second tamper proofing stop. As a further tamper proofing measure, a loaded wire or plastic "meter" antitampering seal may be attached to either of locking tabs 62 and 64, for example by inserting through openings 66.

In addition, insertion of the locking tabs and snap portion respectively through openings 110 and 114 produces a desired alignment of terminal cover 14 with respect to base cover 12. The desired alignment of terminal cover 14 with base cover 12 forms a watertight seal around terminal cavity 46. More specifically, the desired alignment has dam 130, and deflectors 132 and 134 inserting respectively into channels 70, 72 and 74 while also in overlapping contact with ribs 76, 78, 80, thus forming a watertight seal. Channels 72 and 74 also act as rain gutters to direct water flow away from rib 76 and dam 130, and out of channel 70. Overhang 58 of top wall 48 beyond front wall 56 provides an additional barrier to water flow into terminal block cavity 46. The water shed is thus generally directed downward to drain out from the bottom of the meter cover assembly.

In general, the meter cover assembly forms a substantially watertight seal without the use of any gasket. However, in an alternative embodiment, a foam gasket may be included within gasket cavity 140. With a gasket, the desired alignment of terminal cover 14 with base cover 12 has the gasket compressed between top wall 48 of base cover lower portion 20, and the rear surface of terminal cover front wall 104 to provide an extra barrier against water leakage into terminal block cavity 46. Snap portion 90 then also retains terminal cover 14 in the assembled and closed configuration against any opposing pressure from the gasket. As an additional contingency measure, top wall 48 of base cover lower portion 20 forms a substantially smooth surface to which an adhesively backed, water repellant material, such as, for example, a silicone sponge, may be attached to form a second sealing gasket. Thus the meter cover assembly may be used with gaskets to provide added assurance that water will not leak into terminal cavity 46.

Those skilled in the art will recognize that the exact configuration of the locking tabs and openings does not affect the formation of a tamper proof and watertight seal. For example, the size, shape, number and relative positions of the locking tabs may be varied. In addition, the size, shape and relative position of the snap feature may be varied. The meter cover assembly provides an all plastic, low-cost housing for use with A-base utility meters. In addition, the meter cover assembly provides protection of internal A-base meter electronics from wet weather conditions, and without the use of a gasket. The meter cover assembly also protects internal meter electronics from tampering by preventing removal of the terminal cover.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

What is claimed is:

1. A meter base cover comprising:
    a portion having a top wall, a first side wall, a second side wall, a front wall having a front surface, and a bottom wall, forming a terminal block cavity;
    a first locking element extending substantially perpendicularly from the front surface of said front wall;
    a snap element extending from said first side wall; and
    a second locking element extending substantially perpendicularly from said second side wall, so that said second locking element extends substantially perpendicularly relative to said first locking element.

2. A meter base cover in accordance with claim 1 wherein the front surface of said front wall has a plurality of channels therein, and an opening therethrough.

3. A meter base cover in accordance with claim 2 further comprising a plurality of ribs extending from the front surface of said front wall.

4. A meter base cover in accordance with claim 3 wherein said plurality of ribs form a flange surrounding said opening.

5. A meter base cover in accordance with claim 3 wherein said channels are substantially parallel to at least some of said ribs, said ribs interposed between said channels and said opening.

6. A terminal cover for use with a meter base cover, said terminal cover comprising:
    a configuration having a top wall, a first side wall, a second side wall, a bottom wall, and a front wall; and
    wherein said front wall has a front surface and a rear surface, the front surface having an opening therethrough for engaging a first locking element extending from a front surface of a front wall of the meter base cover, and a plurality of mating ribs extending from the rear surface, said mating ribs configured to slidably overlap a plurality of ribs on the front wall of the meter base cover.

7. A terminal cover in accordance with claim 6 wherein said mating ribs are further configured to insert into a plurality of channels in the front surface of the meter base cover front wall.

8. A terminal cover in accordance with claim 6 wherein said first side wall has an opening therethrough for engaging a snap element extending from a first side wall of the meter base cover.

9. A terminal cover in accordance with claim 6 wherein said second side wall has an opening therethrough for engaging a second locking element extending from a second side wall of the meter base cover.

10. A meter cover assembly comprising:
a meter base cover comprising:
- a portion having a top wall, a first side wall, a second side wall, a front wall, and a bottom wall, forming a terminal block cavity, said front wall having an opening therethrough, and a front surface with a plurality of channels therein and a plurality of ribs extending therefrom;
- a first locking element extending substantially perpendicularly from the front surface of said front wall;
- a snap element extending from said first side wall;
- a second locking element extending substantially perpendicularly from said second side wall, so that said second locking element extends substantially perpendicularly relative to said first locking element; and
- a terminal cover for covering the terminal block cavity of said meter base cover, said terminal cover comprising:
  - a configuration having a top wall, a first side wall, a second side wall, a bottom wall, and a front wall; and
  - wherein said front wall has a front surface and a rear surface, the front surface having an opening therethrough for engaging said first locking element, and a plurality of mating ribs extending from the rear surface, said mating ribs configured to slidably overlap said plurality of ribs on the meter base cover.

11. A meter cover assembly in accordance with claim 10 wherein said mating ribs are further configured to insert into said plurality of channels.

12. A meter cover assembly in accordance with claim 10 wherein said terminal cover first side wall has an opening therethrough for engaging said snap element.

13. A meter cover assembly in accordance with claim 10 wherein said terminal cover second side wall has an opening therethrough for engaging said second locking element.

* * * * *